United States Patent [19]

Krob et al.

[11] Patent Number: 4,595,799
[45] Date of Patent: Jun. 17, 1986

[54] MODULARIZED 66-BLOCK

[75] Inventors: Dennis J. Krob, Woodridge; Edward Cieniawa, Clarendon Hills, both of Ill.; Francesio Liburdi, Endicott, N.Y.

[73] Assignee: Allied Corporation, Morris Township, Morris County, N.J.

[21] Appl. No.: 349,123

[22] Filed: Feb. 16, 1982

[51] Int. Cl.³ .......................... H04Q 1/02; H04Q 1/18; H04M 9/00
[52] U.S. Cl. .................................. 179/98; 339/17 C; 361/428; 361/426; 361/400
[58] Field of Search .................... 179/98, 1 PC, 91 A; 339/17 C; 361/428, 426, 400

[56] References Cited

U.S. PATENT DOCUMENTS 4,018,997  4/1977  Hoover et al. ..................... 179/98
4,213,013  7/1980  Perna et al. ..................... 179/98

Primary Examiner—Stafford D. Schreyer
Attorney, Agent, or Firm—Roger H. Criss

[57] ABSTRACT

A termination module for a user reprogrammable telephone system for interconnecting telephone lines with individual telephone instruments. The termination module includes a printed circuit board connecting either a 6-block or 25 wire-pair telephone connector to the telephone lines and a plurality of modular jacks for receiving modular plugs attached to the telephone instruments. Individual telephone instruments serviced by the module may be connected to any of the telephone lines connected to the module.

11 Claims, 7 Drawing Figures

FIG. 3
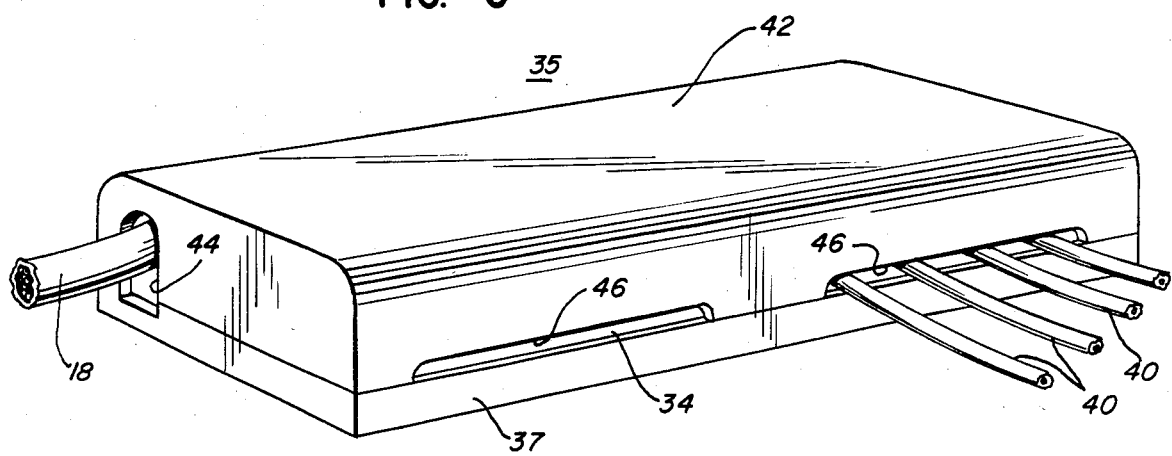
FIG. 4
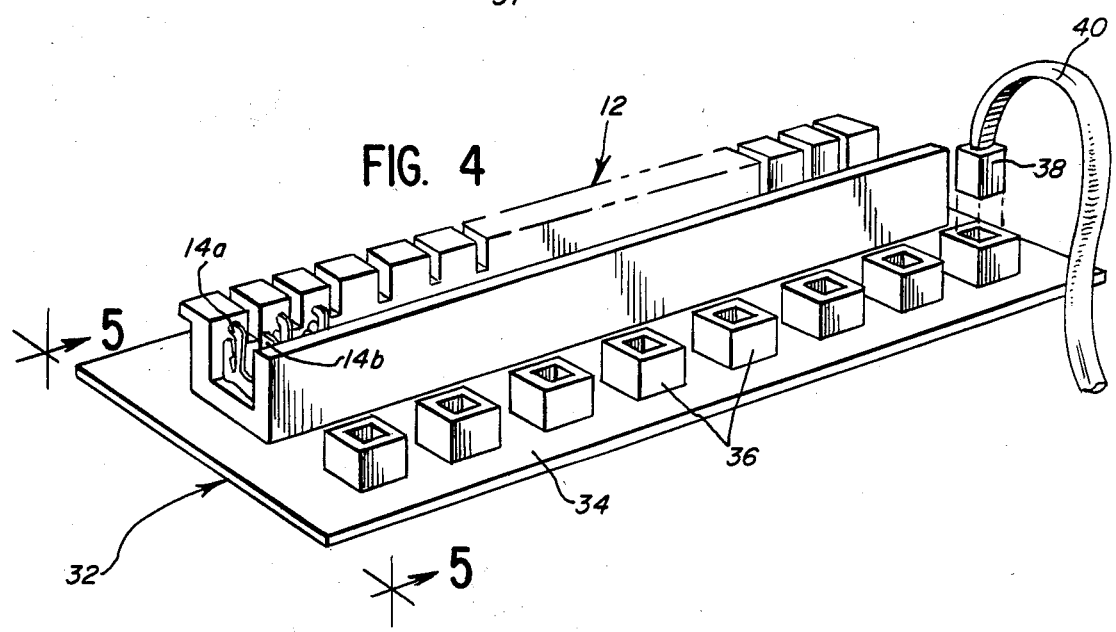
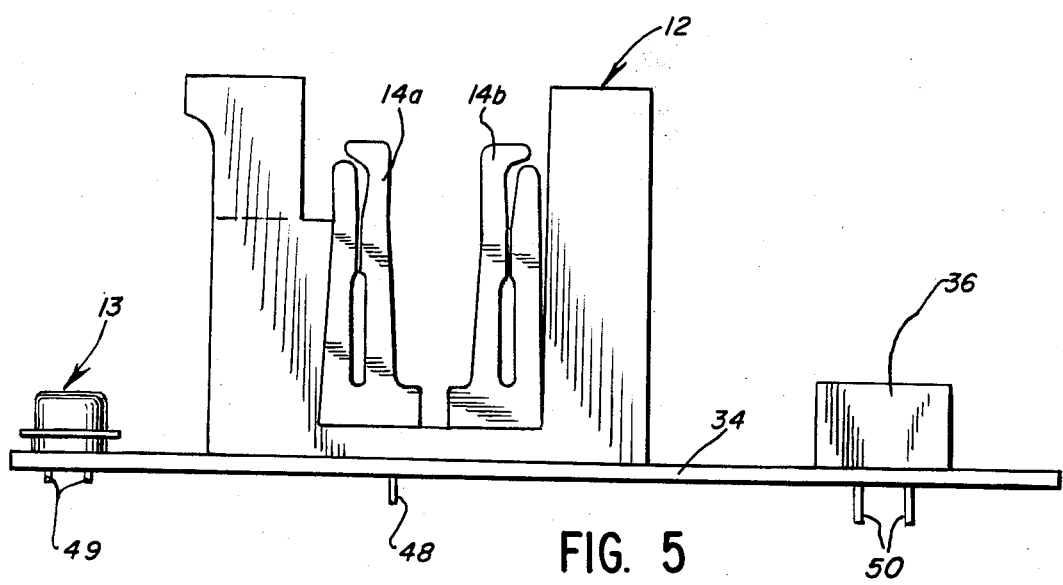
FIG. 5

MODULARIZED 66-BLOCK

BACKGROUND OF THE INVENTION

The present invention relates to a termination module for use in a reprogrammable telephone system for providing telephone service to a multiple telephone instrument service area.

In recent years, the telephone industry has made great strides in reducing telephone equipment installation and maintenance costs. An area of particular concern has been labor costs for reallocating or "reprogramming" telephone numbers among different locations in a service area. Some modularized telephone systems have been developed which minimize field wiring and simplify installation and reprogramming procedures. One prior art system includes a central distribution panel and one or more remote or "satellite" distribution panels permanently wired to the central distribution panel. Patchcords are used with both central and satellite panels to enable reallocation of telephone numbers among individual telephone instruments without physically moving the instruments.

Simple prior art systems are disclosed in U.S. patent application Ser. No. 058,885 filed on July 9, 1979 in the name of Arie Verhagen and application Ser. No. 92,865, now U.S. Pat. No. 4,326,107, filed on Nov. 9, 1979 in the name of Jay Perna both assigned to Bunker Ramo Corporation, the assignee of this application. The Verhagen application discloses a system in which incoming telephone lines are individually hard-wired to a plurality of terminal groups on a panel. Individual telephone instrument cords are field-terminated to special plugs which mate with any of the plurality of terminal groups. Thus only a change of a single "connectorized junction" is needed to reprogram a telephone instrument to a different telephone line. The Perna system represents a further simplification of the Verhagen system in that the special plug connectors are attached to the incoming telephone lines at the factory and the telephone instrument cords hard-wired to the terminal groups on the panel. The Verhagen and Perna systems have significant cost advantages over previous systems, are neat in appearance, provide for all wiring to be done on one side of the terminal block, save space, and since only a single connectorized junction is required for each line and handset, are serviceable by relatively unskilled personnel. Both systems do however require that specialized plug connectors be used with either the incoming telephone lines or the telephone instrument cords.

U.S. patent application Ser. No. 85,170 filed on Oct. 15, 1979 in the name of Michael A. Hodgetts and assigned to Bunker Ramo Corporation discloses a modified cross-connect panel including a plurality of terminal members, each mateable with any of a plurality of relocatable plug connectors identified with individual telephone instruments. The modified panel also permits conventional hard-wiring of the telephone instrument cords should that be desired. All terminals and relocatable connectors are located on one side of the panel.

In many prior art systems, such as the Hodgetts system described above, relatively large multi-contact connectors, commonly referred to in the trade as "66-blocks", are used for hard-wiring the incoming telephone lines and the telephone instrument station cables which may include 25 wire-pairs. In those systems the telephone instrument cords generally have two-four wire pairs terminated to standardized "modular" plugs for mating with standardized "modular " jacks at the respective stations.

The present invention supplies the need for a simple, low-cost termination module capable of accepting either hard-wire or connectorized terminations of incoming telephone lines and providing an output consisting of a plurality of standardized modular jacks for enabling very easy reallocation of telephone numbers by unskilled personnel. It includes a printed circuit board having foil patterns for connecting either a 66-block or a conventional multi-contact telephone connector, with standardized modular jacks for receiving standardized user-removable modular plugs affixed to telephone instrument line cords.

SUMMARY OF THE INVENTION

Accordingly, an object of the present invention is to provide a new and improved low cost termination module for manually allocating telephone lines among a plurality of telephone instruments.

Another object of the invention is to provide such an apparatus that utilizes standardized modular jacks.

In the preferred embodiment of the invention, a termination module for a user reprogrammable telephone system or interconnection apparatus includes a printed circuit board having provision for mounting a multi-contact connector (either a 66-block or standard 25 wire-pair telephone connector) for connection to individual telephone lines. A plurality of standardized modular jacks is mounted on the circuit board and is connected thereby to the multi-contact connector. Each jack is capable of receiving any of a plurality of standardized modular plugs connected to a given telephone instrument line cord. The printed circuit board is double-sided and has plated through holes and circuit foil paths interconnecting groups of contacts of the first multicontact connector with selected contacts of the jacks. The foil paths are conveniently connected to the connector and jacks by conventional wave soldering.

The termination module of the present invention may simply and readily be installed in or near the service area, terminated to the individual incoming telephone lines and be ready to receive the relocatable modular plugs connected to the individual telephone instruments. In a given installation, the entire telephone line cord need only be a two, three, or four wire-pair such as those in the above mentioned copending application systems.

As will be seen, the printed circuit board may be used with either an unterminated 25 wire-pair telephone cable or a "connectorized" telephone cable terminated in a conventional 25 wire-pair connector. Such 25 wire-pair connectors are well known in the telephone industry and may be identified by assignee's trade name Amphenol 57 Series equipped with a printed circuit board header. Normally, either a 66-block or 57 Series connector will be used, although both are usable together in special installations where parallel connections are desired.

Other objects, features and advantages of the invention will be apparent from the following detailed description taken in connection with the accompanying drawings.

BRIEF DESCRIPTION OF THE DRAWINGS

The novel features which are believed to be characteristic of the invention are set forth in the appended claims. The invention itself, however, together with further aspects and attendant advantages thereof, will be best understood by reference to the following description taken in connection with the accompanying drawings in which:

FIG. 3 is a perspective view of the termination module of the present invention, including a cover, and illustrating incoming telephone trunk lines and several individual telephone instrument cords;

FIG. 4 is a perspective view of the termination module of FIG. 3 with the cover removed;

FIG. 5 is an end elevational view of the termination module of FIG. 4 taken along lines 5—5;

DESCRIPTION OF THE PREFERRED EMBODIMENT OF THE INVENTION

Figure 1:
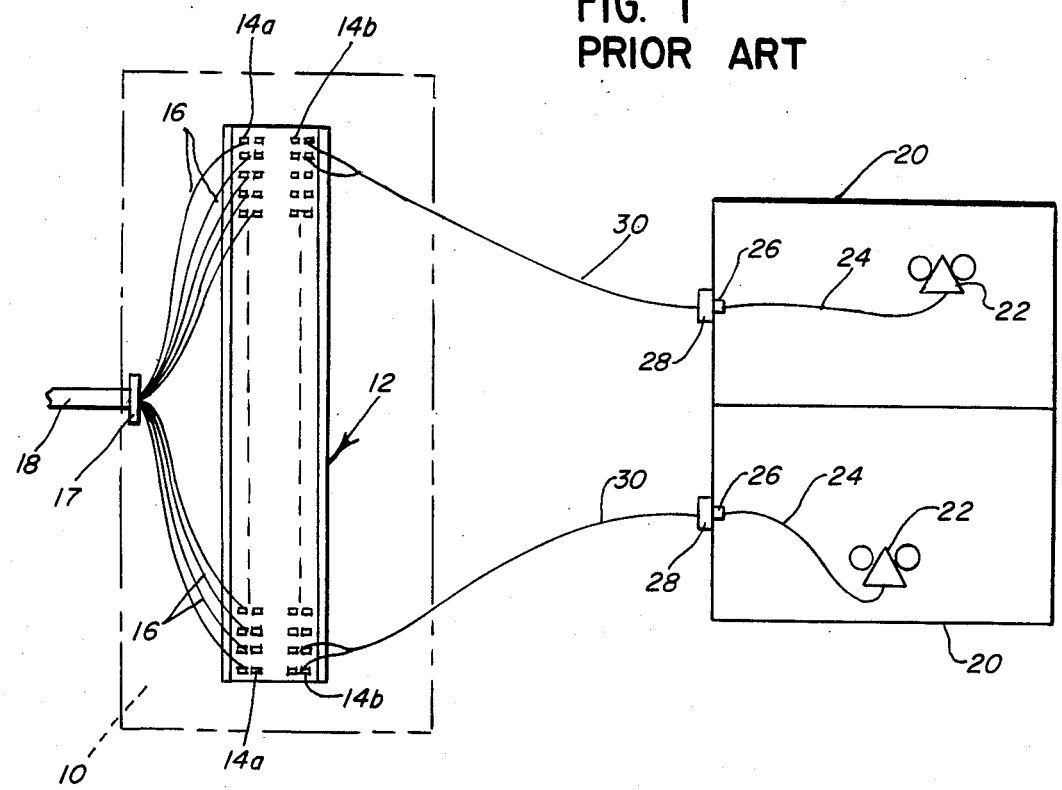
FIG. 1 is a schematic representation illustrating a telephone interconnection system of the prior art.

A prior art telephone system is schematically illustrated in FIG. 1. That system includes a mounting panel 10 for supporting a multi-contact connector, generally designated 12. Those skilled in the art will recognize connector 12 as the well-known "66-block" having a plurality of insulation-piercing contacts 14a and 14b arranged in two groups of two rows of twenty-five each (50 wire-pair total). Contacts 14a are connected to incoming telephone lines 16 of a telephone trunk cable 18 from either central office equipment outside the service area or from a distribution panel within the building. A cable clamp 17 provides strain relief for the terminated ends of the telephone lines in cable 18.

The service area includes a number of discrete physical locations or "stations" 20 each served by one or more telephone instruments 22. Each instrument or handset 22 is coupled to a telephone line cord 24 terminating in a standardized modular plug 26. Older telephone instruments and installations used different plug configurations or were hard-wired to conventional screw terminals in a small wall-mounted junction box. The plugs are receivable in wall-mounted standardized modular jacks 28. Station cables 30 are coupled between the jacks and contacts 14b of 66-block connector 12. In many installations, the station cables comprise 25 wire-pairs and the "jacks" a 25 wire-pair connector such as an Amphenol 57 Series connector mentioned above.

Figure 2:
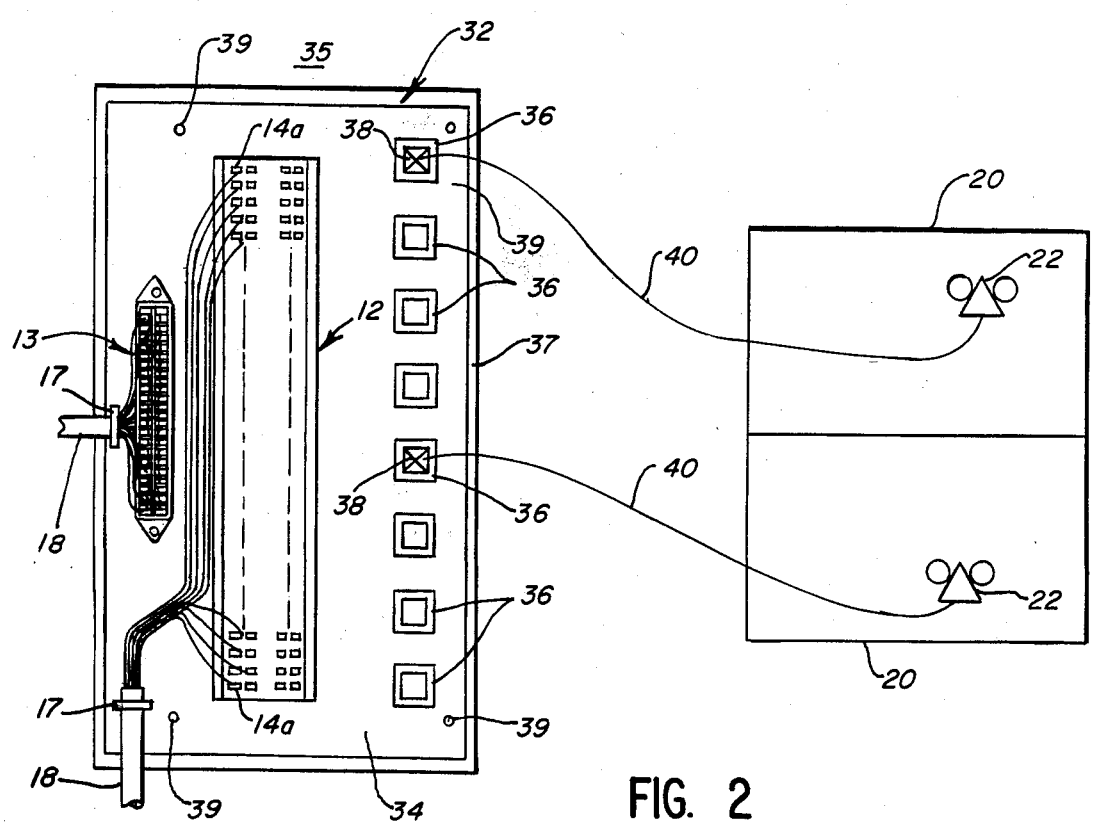
FIG. 2 is a schematic representation illustrating a termination module in accordance with the present invention in a telephone interconnection system.

Referring to FIG. 2, a user reprogrammable telephone system including the termination module of the present invention is generally designated 35. Termination module 35 includes a printed circuit board 34 mounted to a support 37 which in turn may be mounted in an equipment closet or the like. A first conventional multi-contact connector, such as 66-block 12, is mounted on printed circuit board 34 and includes a plurality of contacts 14a for termination to the incoming telephone lines 16 of telephone trunk cable 18 which is fastened to the support (through the printed circuit board) by a strain relief clamp 17. A plurality of standardized modular jacks 36 is mounted on board 34. Jacks 36 are well-known and are identified as either 6 or 8 position jacks. The six position jack has provision for terminating either a 2 or 3 wire-pair telephone line cord and the 8 position may terminate either a 2, 3 or 4 wire-pair line cord. Each modular jack can receive any of a plurality of relocatable standardized modular plugs 38 connected to an individual telephone instrument 32 over a corresponding telephone line 40. The modular plugs permit user reprogramming or reallocation of telephone instruments among incoming telephone lines by simply unplugging from the existing telephone line and plugging into the jack corresponding to the desired telephone line.

As mentioned, telephone line cords 40 may comprise two, three, or four wire-pairs depending upon the type of telephone instrument involved, i.e. loud speaker telephone, multi-line phone, and telephones with features such as hold, intercom, etc. It will also be seen by those skilled in the art that only half of the 66-block is used. It will be appreciated that a full block may be used with suitable-straightforward changes to the printed circuit board and in the number of jacks. It will also be noted that a conventional 57 Series type connector 13 is shown mounted to the printed circuit board for reception of a connectorized incoming telephone cable.

Referring to FIG. 3, termination module 35, including printed circuit board 34 mounted on support 37, is shown with a protective snap-on cover 42. Telephone trunk cable 18 passes through an end aperture 44 in the cover and telephone line cords 40 pass through one or more side apertures 46.

FIGS. 4 and 5 show the general arrangement of 66-block connector 12, 57 Series connector 13, and modular jacks 36 on printed circuit board 34. It will be appreciated that while the 66-block connector and 57 Series connector are not normally used together in an installation (although they may be) they are shown together to simplify the explanation. The 66-block connector, 57 Series connector, and modular jacks are permanently mounted to the printed circuit board at the factory via mounting leads 48, 49, and 50 respectively. Leads 48, 49, and 50 are generally extensions of the contacts (not shown) in the connectors and pass through appropriate apertures in the circuit foil paths (see FIGS. 5 and 6) of circuit board 34 and are connected thereto by wave soldering. As illustrated, a modular telephone plug 38 attached to a telephone line cord 40 is readily mateable with and thereby programmable to any modular jack 36. Each modular jack represents a particular telephone number in this embodiment.

Figure 6:
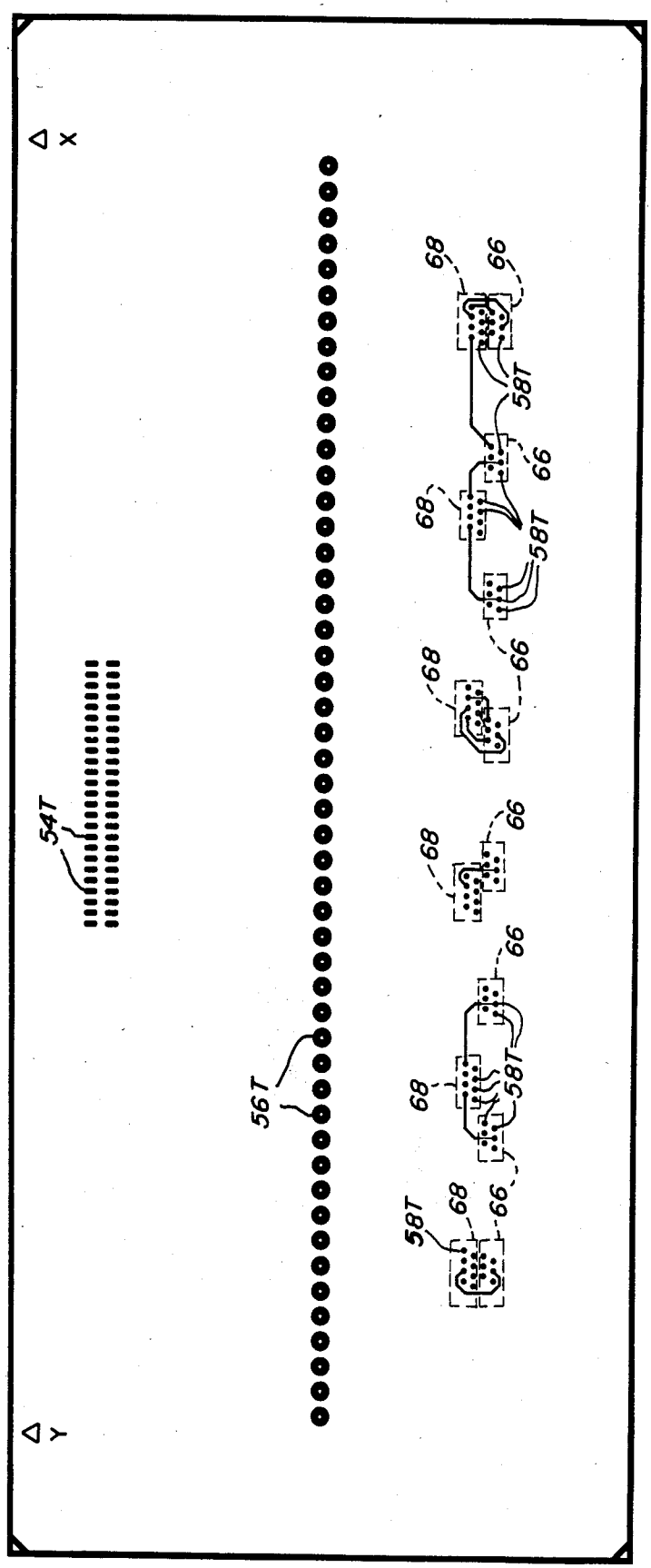
FIG. 6 is a full size top plan view of the printed circuit board used in the termination module constructed in accordance with the present invention.
Figure 7:
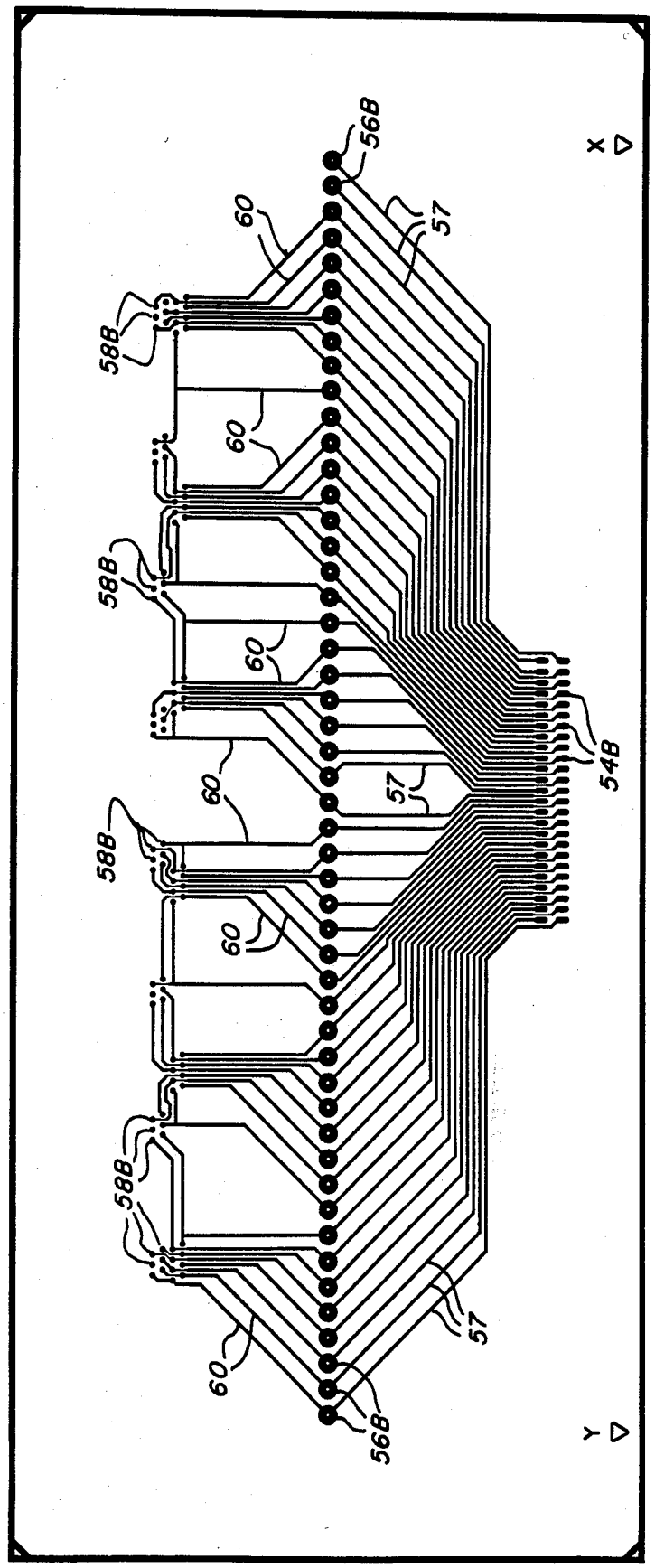
FIG. 7 is a bottom plan view of the printed circuit board of FIG. 6.

Referring to FIGS. 6 and 7, printed circuit board 34 is shown with circuit foil paths for effecting interconnection of the connectors and jacks. FIG. 6 illustrates the top of the board to which the 66-block (or 57 Series connector) and modular jacks 36 are mounted. FIG. 7 shows the bottom of the board and the foil path linking the multi-contact connector leads with the clusters of leads for the modular jacks. These figures also clearly illustrate that circuit board 34 can accommodate either a 66-block or a 25 wire-pair telephone connector or both, since they are electrically connected in parallel.

More particularly, in FIG. 6, printed circuit board 34 includes a row of first terminal areas 56T for receiving and electrically connecting to the leads of the 66-block. With a 66-block installed, its contacts 14a (FIG. 2) may be connected by hard-wiring to the incoming telephone lines as described above. In the event a given service area or areas has a "connectorized" system wherein 57 or 157 Series type telephone connectors are either in use on the telephone lines or are desired in the installation, second terminal areas 54T are provided on printed circuit board 34. Terminal areas 54T are adapted to receive and be electrically connected to the Leads of the 57 Series 25 wire-pair connector for mating with the corresponding connector terminating the incoming telephone lines. Third terminal areas 58T are arranged in clusters on the printed circuit board for electrically connecting to the leads of the modular jacks. The electrical connections may be readily accomplished by wave soldering leads 48, 49, and 50 (FIG. 5) of the connectors and jacks to the appropriate terminal areas.

Each terminal area 54T, 56T and 58T consists of foil surrounding an aperture through the printed circuit board. As is common, these apertures or "through holes" may be internally plated to connect the terminal areas to corresponding terminal areas on the bottom side of the printed circuit board. Thus terminal areas 54T, 56T and 58T on the top side of the board are electrically connected through their respective plated apertures to terminal areas 54B, 56B and 58B on the bottom side of the board.

As clearly shown in FIG. 7, circuit foil paths 60 connect terminal areas 56B to terminal areas 58B and foil paths 57 interconnect terminal areas 54B and 56B. Thus, all of the fifty illustrated terminal areas 56B (and 56T) are connected to respective ones of terminal areas 54B (54T) whereas only forty-eight of these terminal areas are interconnected with individual ones of terminal areas 58B of the modular jacks. This arrangement permits use of either six or eight position modular jacks. The term position should be understood as referring to the number of contacts. Thus a six position modular jack has 6 contacts and an eight position jack eight contacts. The maximum number of contacts required is 6×8 or 48 (either six 8 position jacks or eight 6 position jacks).

As seen in FIG. 6, the six position jacks would occupy the dashed line areas on the board indicated by reference numerals 66 and the eight position jacks the dashed line areas indicated by numerals 68. For the full interconnection of the circuit foil paths to be seen, position the printed circuit board top view of FIG. 6 and bottom view of FIG. 7 adjacent each other with arrow X and Y on each view in alignment. Either FIG. 6 or FIG. 7 may then be folded under the other along the line joining X and Y and held up to a strong light to simultaneously view the near side foil paths and opposite side foil paths.

It should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the accompanying claims.

What is claimed is:

1. A termination module for interconnecting telephone lines with individual telephone instruments equipped with modular plug terminations comprising:
    a printed circuit board;
    a multi-contact connector mounted on said printed circuit board including a plurality of contacts for termination to said telephone lines;
    a plurality of modular jacks mounted on said printed circuit board for receiving any of the modular plugs on the individual telephone instruments and;
    means on said printed circuit board including circuit foil paths electrically interconnecting the contacts of said multi-contact connector with those of said modular jacks to uniquely associate a given set of said contacts with an individual one of said jacks, whereby the need for patchcords for cross-connection between a specific telephone line and a specific telephone instrument is eliminated.

2. The termination module of claim 1 wherein said multi-contact connector comprises a 66-block mechanically and electrically affixed to said printed circuit board.

3. The termination module of claim 2 wherein said means on said printed circuit board includes provisions for mounting either six position modular jacks or eight position modular jacks, said circuit foil paths further interconnecting common positions of said six and eight position modular jacks.

4. The termination module of claim 3 wherein said means on said printed circuit board further include provision for mounting and electrically interconnecting a 25 wire-pair telephone connector in parallel with said 66-block connector; and
    a 25 wire-pair connector mounted and electrically connected to said printed circuit board.

5. The termination module of claim 1 where said multi-contact connector includes a 25 wire pair telephone connector mechanically and electrically affixed to said printed circuit board.

6. The termination module of claim 5 wherein said means on said printed circuit board includes provisions for mounting either six position modular jacks or eight position modular jacks, said circuit foil paths further interconnecting common positions of said six and eight position modular jacks.

7. A termination module for interconnecting telephone lines with individual telephone instruments equipped with modular plug terminations comprising:
    a printed circuit board;
    a 66-block mechanically and electrically affixed to said printed circuit board and including a plurality of contacts for termination to said telephone lines;
    means on said board for mechanically and electrically affixing thereto a first plurality of eight position modular jacks or a second plurality of six position modular jacks or a third plurality of intermixed six and eight position modular jacks, said third plurality being less than either said first or said second plurality;
    means on said printed circuit board including circuit foil paths electrically interconnecting said 66-block with individual ones of said modular jacks to uniquely associate given sets of 66-block contacts with individual ones of said jacks; and
    said circuit foil paths including interconnections between the common positions of said six and eight position modular jacks, whereby the need for patchcords for cross-connection between a specific telephone line and a specific telephone instrument is eliminated.

8. A printed circuit board for use in a termination module for selectively interconnecting telephone lines to individual telephone instruments each having line cords terminated in modular plugs, comprising:
    first means on said board for mechanically and electrically affixing a multi-contact telephone connector thereto;

second means on said board for mechanically and electrically affixing thereto a plurality of modular jacks for connection to the modular plugs of telephone instruments; and circuit foil means on said board interconnecting discrete sets of said contacts on said multi-contact connector to individual ones of said plurality of modular jacks, whereby the need for patchcords for cross-connection between a specific telephone line and a specific telephone instrument is eliminated.

9. The printed circuit board set forth in claim 8 wherein said second means comprises first foil terminal areas for receiving a first plurality of eight position modular jacks and second foil terminal areas for receiving a second plurality of six position modular jacks, and wherein said circuit foil means includes interconnections between said first and second foil terminal areas corresponding to the common positions of said six position and said eight position modular jacks.

10. The printed circuit board as set forth in claim 9 wherein said first means includes third terminal areas for receiving a 66-block type electrical connector and fourth terminal areas for receiving a 25 wire-pair type telephone connector, and wherein said circuit foil means further include foil paths connecting said first and second terminal areas in parallel.

11. A printed circuit board for use in a termination module for selectivity interconnecting telephone lines to individual telephone instruments each having line cords terminated in modular plugs, comprising:

first means in said board for mechanically and electrically affixing thereto either a 66-block telephone connector or a 25 wire-pair telephone connector for coupling to telephone lines;

second means on said board for mechanically and electrically affixing thereto a first plurality of eight position modular jacks or a second plurality of six position modular jacks or a third plurality of intermixed six and eight position modular jacks, for connection to said modular plugs on said telephone instrument line cords; and circuit foil paths on said board interconnecting said first means with said second means for coupling discrete sets of contacts of said connector to individual ones of said modular jacks, whereby the need for patchcords for cross-connection between a specific telephone line and a specific telephone instrument is eliminated.

* * * * *